(12) United States Patent
Klinga et al.

(10) Patent No.: US 9,425,734 B2
(45) Date of Patent: Aug. 23, 2016

(54) JUNCTION COVER FOR PHOTOVOLTAIC PANEL MODULES

(71) Applicants: Christopher Klinga, Boulder, CO (US); Scott Franklin, Nederland, CO (US)

(72) Inventors: Christopher Klinga, Boulder, CO (US); Scott Franklin, Nederland, CO (US)

(73) Assignee: LUMOS LSX, LLC, Boulder, CO (US)

( * ) Notice: Subject to any disclaimer, the term of this patent is extended or adjusted under 35 U.S.C. 154(b) by 72 days.

(21) Appl. No.: 14/602,883

(22) Filed: Jan. 22, 2015

(65) Prior Publication Data

US 2015/0129020 A1    May 14, 2015

Related U.S. Application Data

(63) Continuation-in-part of application No. 13/180,955, filed on Jul. 12, 2011, now Pat. No. 8,946,539.

(60) Provisional application No. 61/363,544, filed on Jul. 12, 2010.

(51) Int. Cl.

| | | |
|---|---|---|
| *H02S 40/34* | (2014.01) | |
| *H02S 20/23* | (2014.01) | |
| *H01L 31/02* | (2006.01) | |
| *H01L 31/05* | (2014.01) | |
| *H02S 40/36* | (2014.01) | |

(52) U.S. Cl.
CPC .......... *H02S 40/34* (2014.12); *H01L 31/02021* (2013.01); *H01L 31/05* (2013.01); *H02S 20/23* (2014.12); *H02S 40/36* (2014.12); *Y02B 10/12* (2013.01); *Y02E 10/50* (2013.01)

(58) Field of Classification Search
CPC ... H01L 31/00; H01L 31/02; H01L 31/02002; H01L 31/02008; H01L 31/02013; H01L 31/02021; H02S 40/30; H02S 40/34
See application file for complete search history.

(56) References Cited

U.S. PATENT DOCUMENTS

| | | | |
|---|---|---|---|
| 6,344,612 B1 | 2/2002 | Kuwahara et al. | |
| 6,360,497 B1 | 3/2002 | Nakazima et al. | |
| 6,655,987 B2 | 12/2003 | Higashikozono et al. | |
| 7,134,883 B2 | 11/2006 | Werner et al. | |
| 8,113,853 B2 | 2/2012 | Coyle, Jr. et al. | |
| 8,512,050 B2 | 8/2013 | McGreevy et al. | |
| 8,748,743 B2 | 6/2014 | Xiao et al. | |
| 8,900,019 B2 | 12/2014 | Yamaguchi et al. | |
| 2010/0218802 A1 | 9/2010 | Quiter | |
| 2011/0108085 A1 | 5/2011 | Quiter | |
| 2011/0183531 A1 | 7/2011 | Hornung et al. | |
| 2011/0195585 A1 | 8/2011 | Feldmeier et al. | |

*Primary Examiner* — Christina Chern
(74) *Attorney, Agent, or Firm* — Hoffmann & Baron, LLP

(57) ABSTRACT

A junction cover for a photovoltaic (PV) panel module system that includes a PV panel mounting structure, a rail, a PV module with a junction box and wiring extending between the rail and the junction box. The junction cover encloses the junction box and wiring and includes a lid and a wire housing. The lid has a plurality of sides and is releaseably attached to the junction box. The wire housing includes a top plate having proximal and distal ends, first and second sides and first and second side walls extending downwardly from the first and second sides. The top plate extends from a first side of the lid and slopes downwardly to the distal end. The top plate and side walls define an interior and an opening at the distal end. When the lid is attached to the junction box, the wiring extending between the rail and the junction box is within the wire housing.

20 Claims, 13 Drawing Sheets

SECTION B-B

SECTION C-C

JUNCTION COVER FOR PHOTOVOLTAIC PANEL MODULES

This application is a continuation-in-part of application Ser. No. 13/180,955, filed on Jul. 12, 2011 and claims priority from provisional application Ser. No. 61/363,544, filed on Jul. 12, 2010, all of which are hereby incorporated by reference herein in their entirety for all purposes.

FIELD OF INVENTION

The present invention relates to a junction cover, a system that includes a junction cover and a method for covering wiring at junctions between electrical junction boxes for photovoltaic panel modules and wiring conduits, wireways and/or raceways.

BACKGROUND OF THE INVENTION

Photovoltaic ("PV") panels, also known as solar panels, are well known in the art for converting solar energy into electrical energy. As used herein, the term photovoltaic refers to the generation of a voltage when radiant energy falls on the boundary between dissimilar substances, such as two different semiconductors. As the desirability for clean and efficient energy sources increases, so does the desire to use power sources such as PV panels.

When PV panels are installed, the wiring is routed to a junction box on the backside of the module. Positive and negative wires leave the junction box and are connected to the wires of the adjacent modules (also referred to as inter-module wiring). The wiring for all of the PV panels in a system is then connected to the main power line for the site. Since PV panels are typically located on the roofs of structures, the panel wiring is often subject to extreme weathering conditions and abrasion by animals can degrade and damage the wiring's insulation. Damage to the wiring can require costly service repairs and can keep the affected panels offline until such repairs are made. Best practice would be to protect all inter-module wiring in a conduit. However, this is not a standard today due to the high cost that is involved. Accordingly, there is a need for a cost effective and efficient system to protect the wiring for PV panels.

SUMMARY OF THE INVENTION

The present invention is directed to a junction cover for a photovoltaic (PV) panel module system that includes a PV panel mounting structure, a rail, a PV module with a junction box and wiring extending between the rail and the junction box.

In a first embodiment, the junction cover also includes a member extending upwardly from each of the feet to a distal end. Each of the members has a notch near the distal end on the side of the member facing the open end of the nose section, which is adapted to engage the rail. The open end of the nose section, the feet and the members define a channel that is adapted to receive the rail. When the notches engage the rail and the PV panel is attached to the PV panel mounting structure, the junction cover cannot be removed without detaching the PV panel from the mounting structure. The side walls extend from the base section to the feet and define the open end of the nose section and an open end of the base section. Preferably, the side walls extend outwardly from the plate and are arcuately shaped. The first and second side walls can also curve inwardly towards each other as they extend in the direction of the members. The first embodiment of the junction cover can also include a planar section of the plate that extends from the open end of the base section.

In a second embodiment, the junction cover also includes a plurality of cover retaining members extending from the interior surface, which are adapted to secure the junction cover to the junction box. Each of the cover retaining members is formed by one or more ribs having a stepped receiving portion for receiving the corners of the junction box to secure the cover to the junction box. Each of the side walls can also have two flexible legs that include the cover retaining members. At least one of the legs can have an aperture adjacent to the ribs. To remove the cover from the junction box, a tool is inserted into one of the apertures to disengage one of the stepped receiving portions from a corner of the junction box. The base section is dimensioned so that the legs can accommodate junction boxes having different dimensions. Each of the feet has a substantially flat bottom that is substantially parallel to the plate of the base section. The feet are inserted between the rail and the PV panel.

In a third embodiment, the junction cover for a photovoltaic (PV) panel module system encloses the junction box and the wiring between the mounting rail and the junction box. The junction box includes a lid and a wire housing. The lid has a plurality of sides and is releaseably attached to the junction box. The wire housing includes a top plate having proximal and distal ends, first and second sides and first and second side walls extending downwardly from the first and second sides. The top plate extends from the proximal end connected to a first side of the lid and slopes downwardly to the distal end. The top plate and side walls define an interior and an opening at the distal end. When the lid is attached to the junction box, the wiring extending between the rail and the junction box is within the wire housing.

The lid can have a perimetrical side wall extending downwardly and continuously from the plurality of sides, which sealably encloses the junction box. The lid can include one or more attachment means for securing the lid to the junction box; preferably, the lid comprises one or more attachment means on at least two of the plurality of sides. The attachment means can be prongs or latches extending from one or more of the plurality of sides of the lid. The prongs engage apertures in the junction box or the latches engage catches on the junction box. The attachment means can also be clips that extend from one or more of the plurality of sides of the lid. The clips engage recessed areas on the exterior of the junction box to secure the lid to the junction box.

The side walls can be triangularly shaped and substantially parallel. The side walls can also extend inwardly towards one another between the proximal and distal ends. Each of the first and second side walls of the wire housing has a first height at the proximal end and a second height at the distal end. Preferably, the first height is at least twice as high as the second height. Preferably, the side walls of the wire housing extend below the perimetrical side wall of the lid.

BRIEF DESCRIPTION OF THE DRAWINGS

The preferred embodiments of the junction cover for PV panels of the present invention, as well as other objects, features and advantages of this invention, will be apparent from the accompanying drawings wherein.

DETAILED DESCRIPTION

Figure 1:
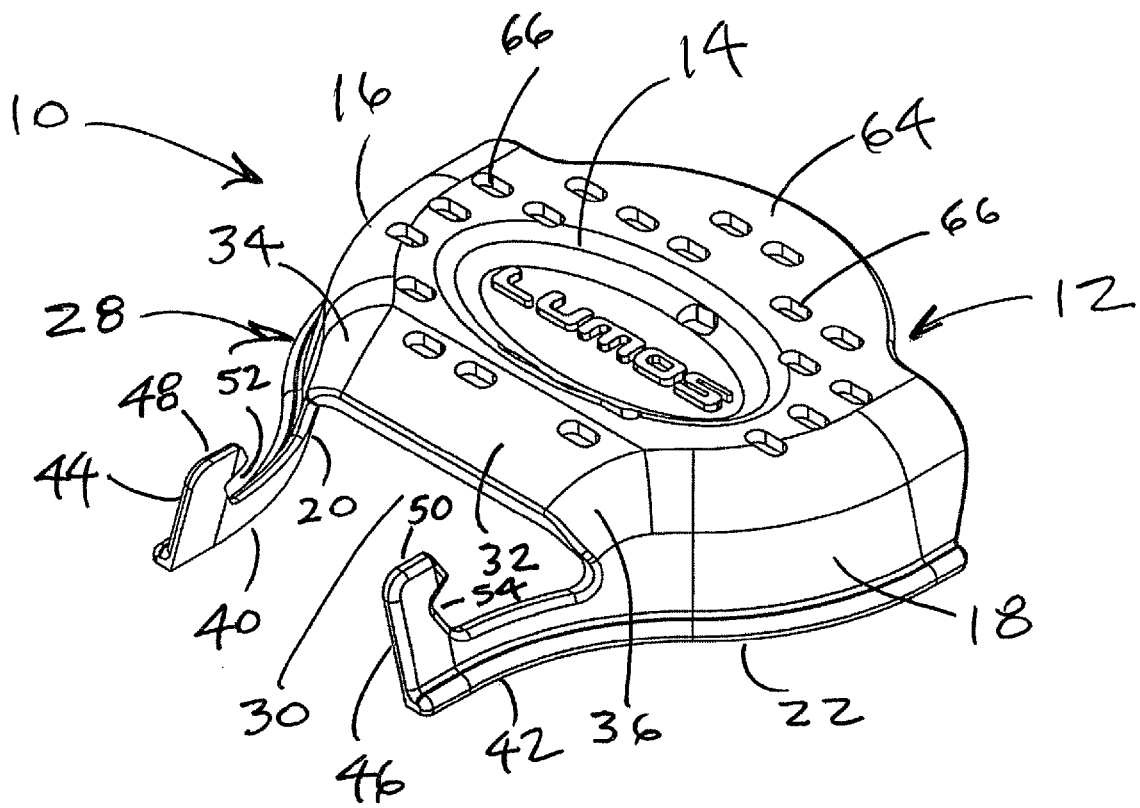
FIG. 1 shows a perspective view of a first embodiment of the junction cover for a photovoltaic (PV) panel module.
Figure 2:
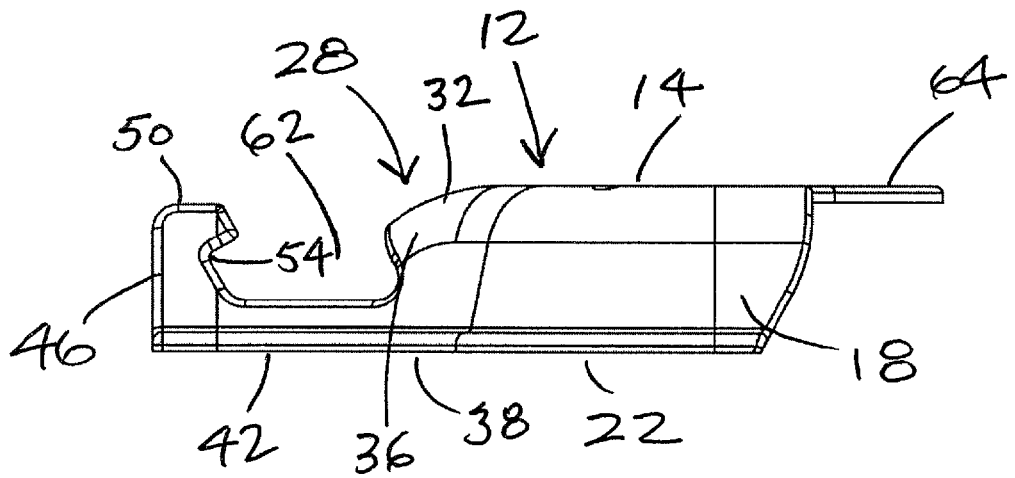
FIG. 2 shows a side view of the first embodiment of the junction cover for a photovoltaic (PV) panel module of FIG. 1.
Figure 3:
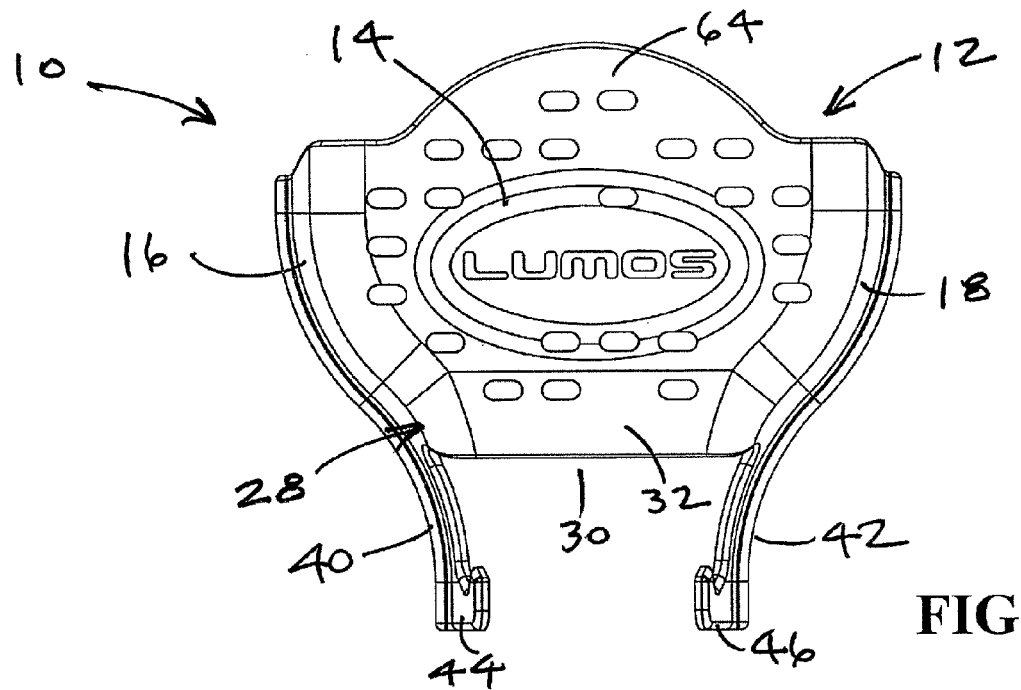
FIG. 3 shows a top, exterior view of the first embodiment of the junction cover for a photovoltaic (PV) panel module of FIG. 1.
Figure 4:
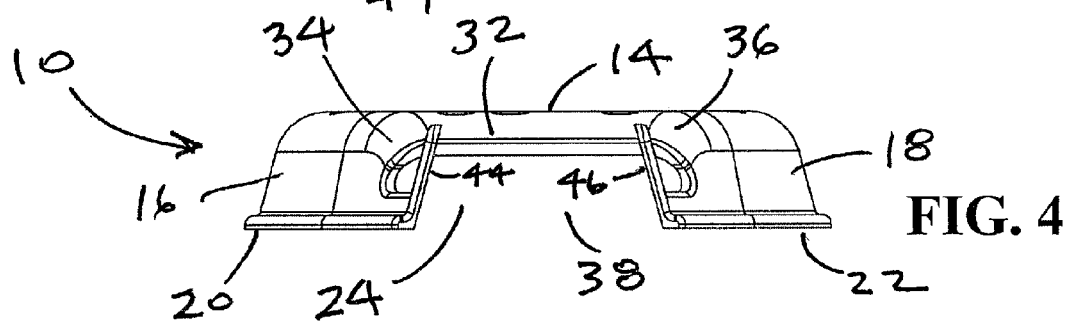
FIG. 4 shows an end view of the first embodiment of the junction cover for a photovoltaic (PV) panel module of FIG. 1.
Figure 5:
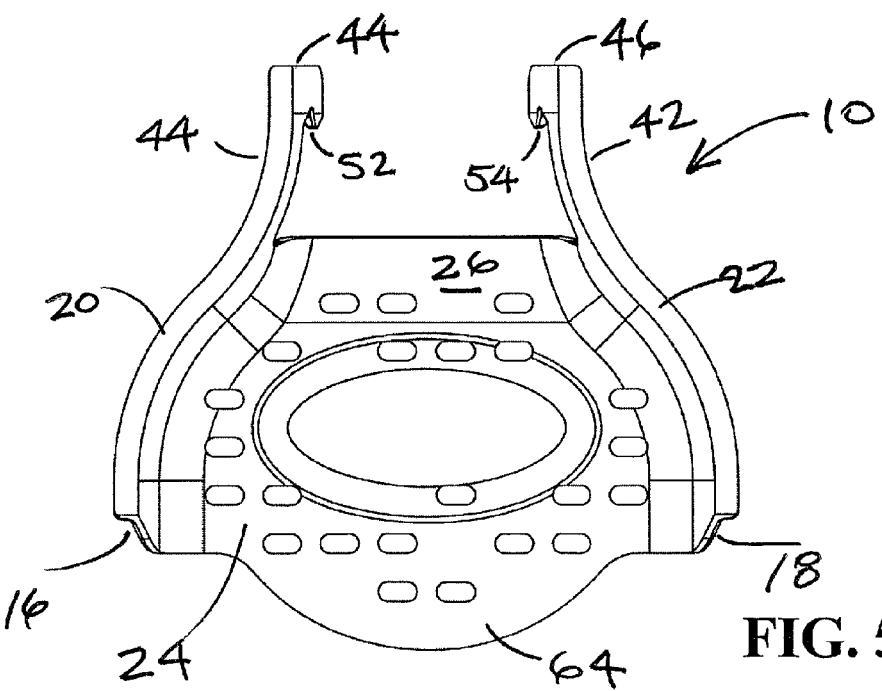
FIG. 5 shows a bottom, interior view of the first embodiment of the junction cover for a photovoltaic (PV) panel module of FIG. 1.

The present invention relates to junction covers that are used to protect the wires connecting the junction box on a PV panel to the inter-module wiring housed in the PV panel rail mounting system. The junction cover provides a cost effective conduit for the wire to travel between the junction box and the rail mounting system. The junction cover also provides weather and rodent protection for the inter-module wiring. The dimensions of the junction cover can be varied to accommodate different types and shapes of junction boxes on the PV panels as well as different rail profiles.

In the first embodiment, one end of the junction cover is attached to the rail mounting system and the second end extends over the junction box when the PV panel is attached to the rail mounting system. In the second embodiment, one end of the junction cover is attached to the junction box and the second end extends under the rail system. The junction covers are designed so that they can be easily repositioned to accommodate the locations of the junction boxes and the wiring termination points on the rail mounting system. In the third embodiment, the junction cover includes a lid that fits over and seals the top of the junction box and a wire housing that extends from one side of the lid to the rail system to protect the wiring from damage. The wire housing slopes downwardly from the lid so that the distal end is adjacent to the rail.

A mounting system for installing photovoltaic (PV) panels to a structure, such as a roof, includes a rail for attaching the panels and housing the inter-module wiring, a junction box on each panel and wires connecting the junction boxes and the inter-module wiring housed in the rail. The mounting system allows an array of PV panels made up of a plurality of panels to be mounted in various configurations and the electricity generated by the PV panels to be collected. The mounting system can also include brackets for attaching the rails to the structure.

The PV panel modules typically include a module junction box disposed on the underside of the panel. The junction box provides a termination point for the individual photovoltaic cells which make up the PV panel and allows the electricity generated by the PV panel to be collected. The junction boxes can include box connectors for connecting the panel modules together. The panel modules may be electrically connected in series and/or parallel in order to achieve a desired output voltage and/or current. The electricity generated can then be connected to the electrical service of the residence, building or property for use by the property owner or resident.

The panel modules are attached to the rail mounting system so that the junction boxes are adjacent to one of a plurality of electrical connection stations on the rail. In order to electrically interconnect the panel modules, at least one electrical connection stations is provided for each PV panel. Each connection station includes electrical module connectors which connect to the junction box connector on the panel modules. The module connectors can be flexible wiring connectors and/or rigid connectors. The connections between the junction boxes and the module connectors allow the panel modules to be easily connected and disconnected (e.g., plugged and unplugged). This facilitates installation and/or disassembly of the panel mounting system.

Wiring from the module connectors can run along the length of the rail system to a termination point and can be factory-installed in the rail or the module connectors can be placed within the rail system when the module is installed. If the wire is preinstalled within the rail, an installer would need only to connect the junction box to the module connectors to make the electrical connection for the panel modules. If not, the installer can make the connection to the adjacent module during the installation. In order to provide a protected path for the wiring, a wireway can be provided as part of the rail and can include the connection stations. The wireway can be a generally C-shaped member so that, when it is connected to the rail, it forms an enclosed conduit or partially open raceway. The wireway can be formed of metal, plastic, or other material, such as a carbon composite, and designed so that it clips onto the rail. If the wireway is not integral to the rail system, an outer surface of the rail can include an outwardly extending ridge and a bottom surface with a downwardly projecting rim to facilitate the attachment of the wireway. The wireway can include a hook-shaped lip extending along one end which engages the rim. The other end of the wireway slips over the ridge and secures the wireway to the rail. It is within the contemplation of the present invention that the wireway may be attached to the rail in a number of ways including by the use of fasteners, such as screws and/or bolts.

In some embodiments, an array of panel modules can be electrically connected using a common ground or reference line. The power line can be divided into segments to connect the positive terminal of a panel module to the negative terminal of another panel module. As such, an array of panel modules can be electrically connected in a cascading manner where the outputs (positive terminals) of a panel module serve as inputs (negative terminal(s)) for the next panel module in the array.

The junction covers can be used to cover wiring at a PV module junction box between the junction box and the rail and/or a wire way of a rail of a PV panel mounting system. Embodiments of the junction covers can be used as part of a PV panel mounting system, such as that described herein and/or in U.S. patent application Ser. No. 12/743,476, filed on Mar. 12, 2010, which is incorporated by reference herein in its entirety. Embodiments of the junction covers can also be used with framed modules, frameless modules, as well as other standard and nonstandard PV modules. Different embodiments of the junction covers can be configured to accommodate different sized and shaped junction boxes and different distances between the junction boxes on PV modules and the rails and/or wire ways of the PV mounting system.

The junction covers of the present invention will now be described in terms of the drawings. FIGS. 1-14 show a first embodiment of the junction cover 10 and FIGS. 1-5 show the junction cover 10 having a base section 12 formed by a plate 14 with first and second side walls 16, 18 extending downwardly therefrom to a pair of edges 20, 22 to define an interior 24 with an interior surface 26. The junction cover 10 also includes a nose section 28 extending from the base section 12 to an open end 30. The nose section 28 has a top wall 32, two sides 34, 36 formed by the side walls 16, 18 of the base section 12 and an open side 38 opposite the top wall 32. A pair of feet 40, 42 extends from either side of the open end 30 of the nose section 28. The feet 40, 42 engage the rail 84 (FIGS. 10 and 14) to secure the junction cover 10 in place. A member 44, 46 extends upwardly from each of the feet 40, 42 to a distal end 48, 50. The members 44, 46 have notches 52, 54 near the distal ends 48, 50 on the side 56, 58 of the members 44, 46 facing the open end 30 of the nose section 28.

Figure 14:
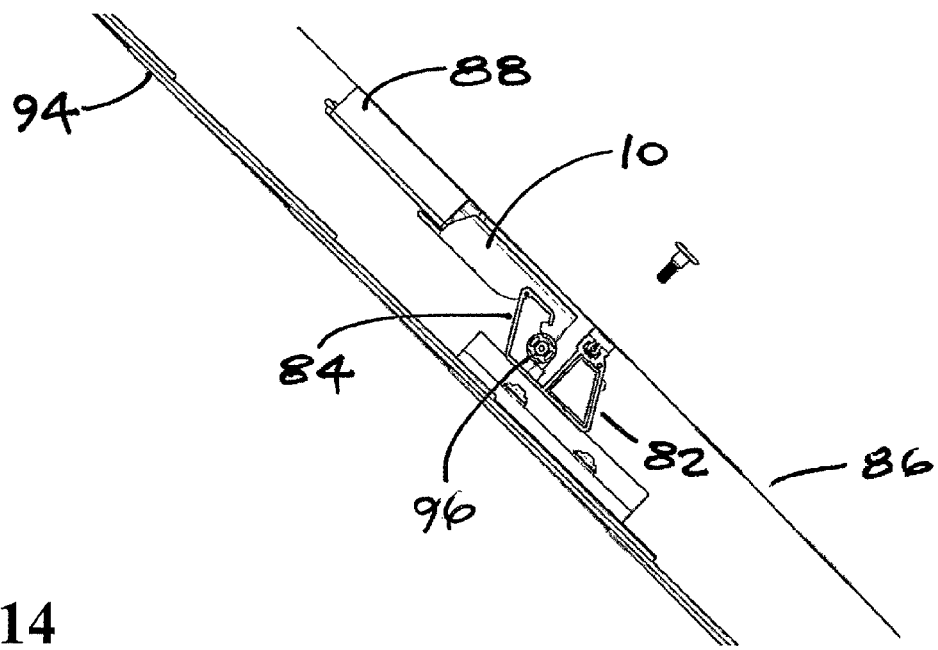
FIG. 14 a side view of the first embodiment of the junction cover shown in FIG. 13 installed on the rail and housing the connection with the junction box on the PV panel.
Figures 15, 16:
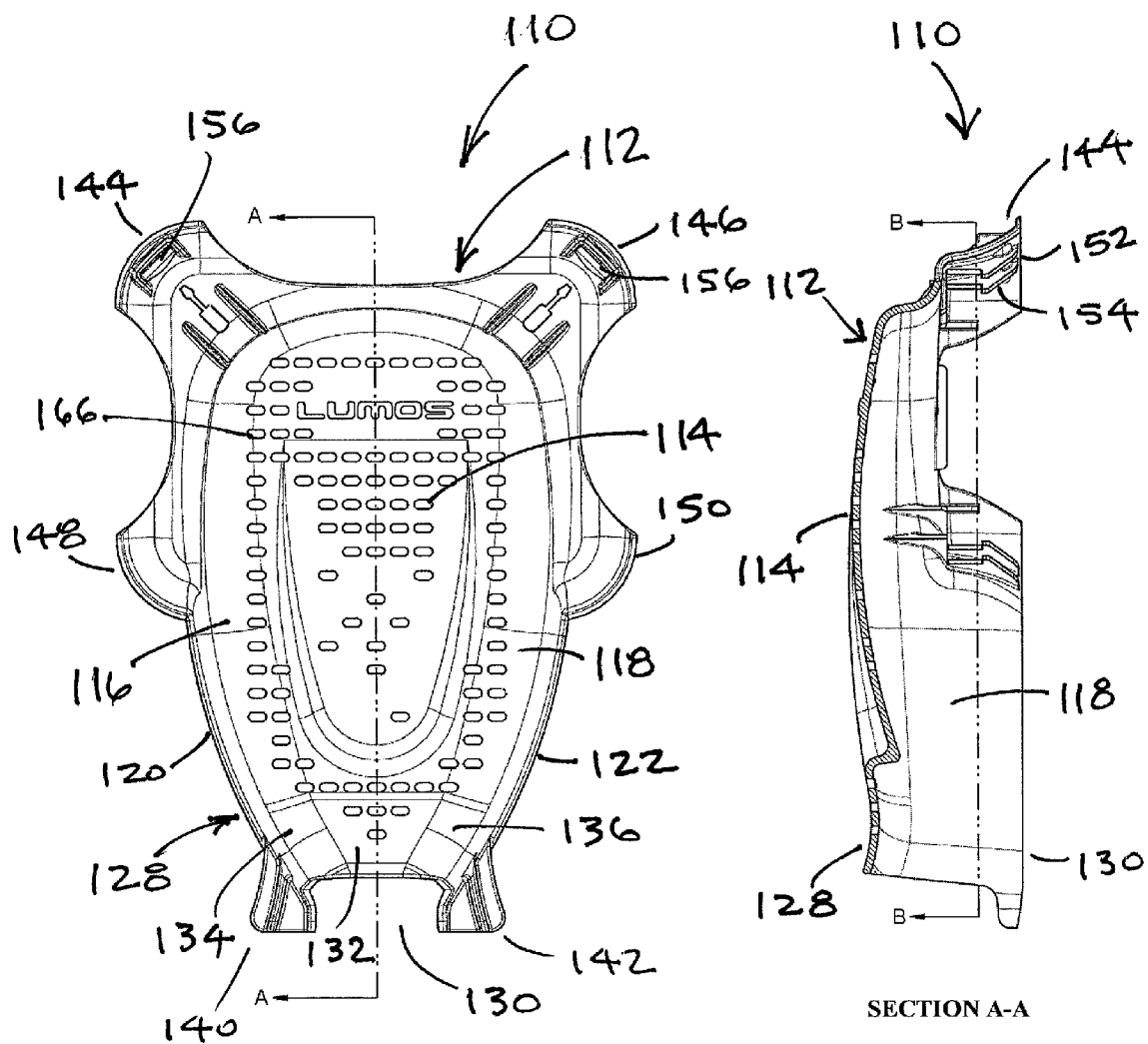
FIG. 15 is a top view of a second embodiment of the junction cover of the present invention.
FIG. 16 is a side sectional view of the second embodiment of the junction cover shown in FIG. 15 taken across section A-A.
Figure 17:
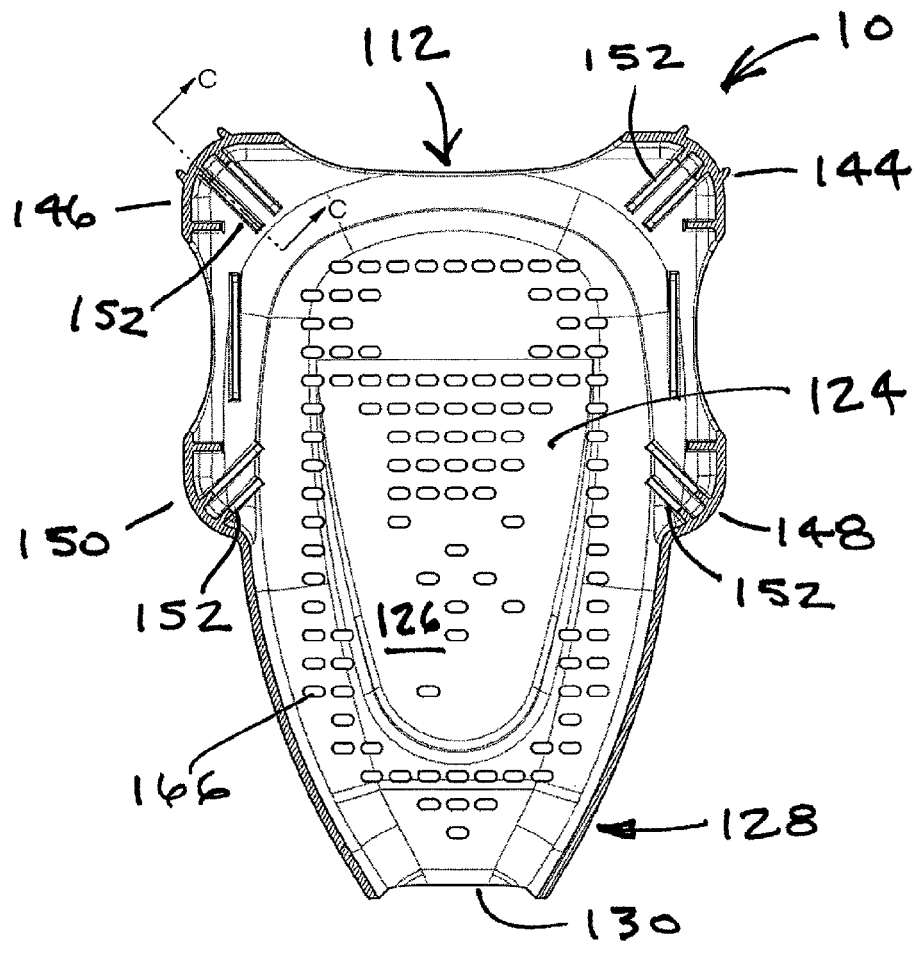
FIG. 17 is a cross-sectional interior view of the second embodiment of the junction cover of FIG. 16 taken across section B-B.
Figure 18:
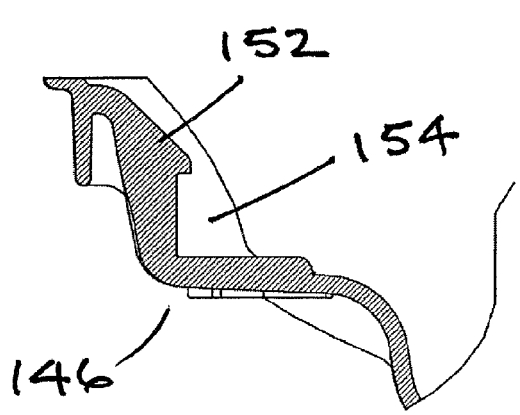
FIG. 18 is a detailed view of one of the corners of the second embodiment of the junction cover of FIG. 17 taken across section C-C.

The side walls 16, 18 extend from the base section 12 to the feet 40, 42 and define the open end 30 of the nose section 28 and an open end 60 of the base section 12. The open end 30 of the nose section 28, the feet 40, 42 and the members 44, 46 define a channel 62 (see FIG. 2) that is adapted to engagingly receive the rail 84 (FIG. 14). The base section 12 can also include a planar section 64 of the plate 14 that extends from the open end 60 of the base section 12. In addition, the base section 12 and/or the nose section 28 can have a plurality of apertures 66 to provide ventilation and prevent water from collecting in the cover 10.

Figure 6:
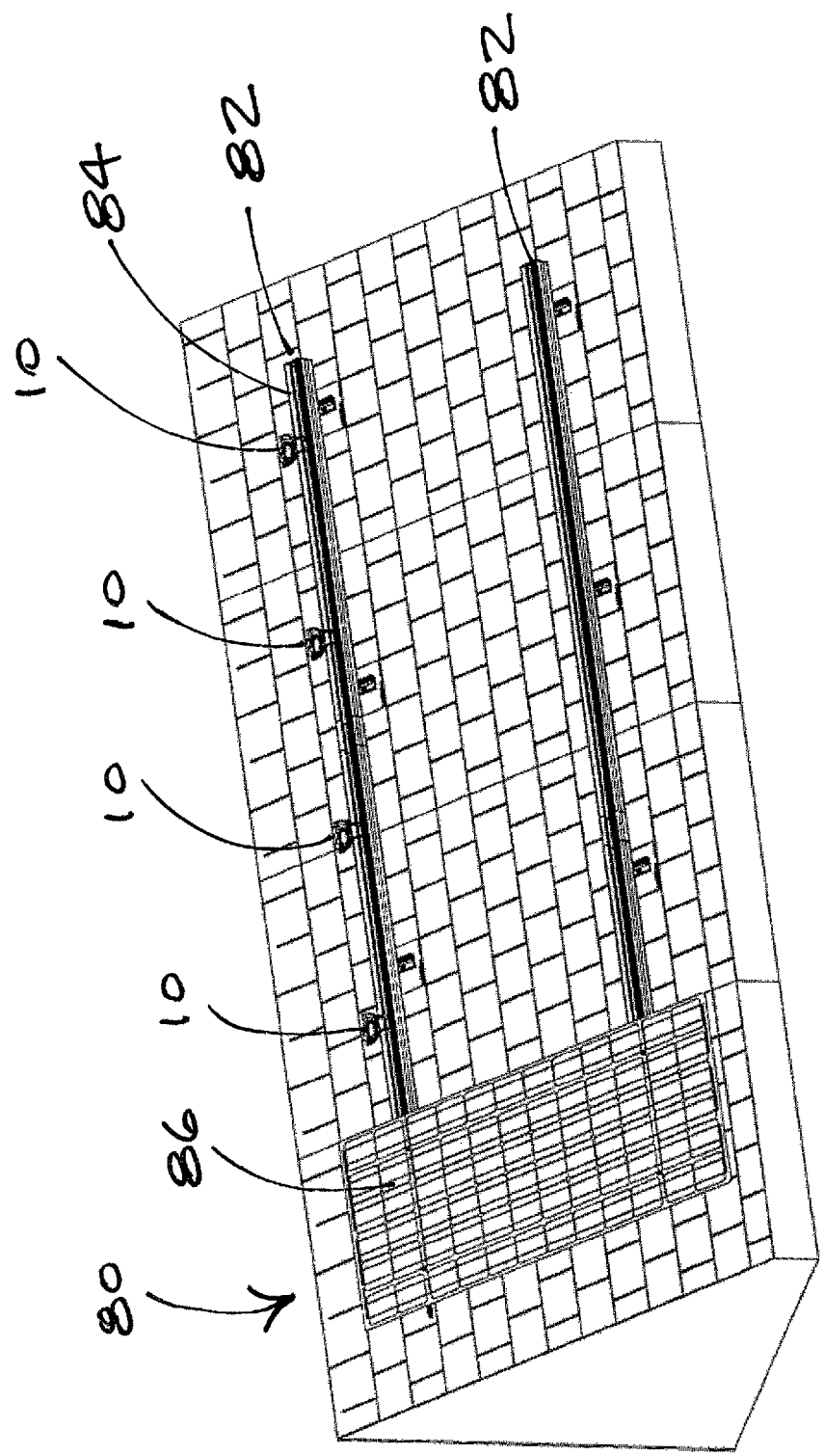
FIG. 6 shows a mounting system for photovoltaic (PV) panels with a plurality of the first embodiment of the junction cover of FIG. 1 secured to the rail.

FIGS. 6-14 show a photovoltaic (PV) panel module system 80 that includes a PV panel mounting structure 82 with a rail 84 and a PV module 86. A junction box 88 is attached to the rear surface 90 of the PV panel 86 (opposite the surface disposed towards the sun) and wiring 92 extends between the rail 84 and the junction box 88. As shown in FIG. 6, the PV panel module system 80 is typically attached to a structure 94, such as the roof of a building. The PV panel mounting structure 82 is used to support one or more PV modules 86. The junction boxes 88 on the rear of the PV modules 86 are electrically connected to the inter-module wiring 96 housed in the rail 84 via an electrical connection station 98 on the rail 84. Generally, one electrical connection station 98 is provided for each PV module 86.

Figure 7:
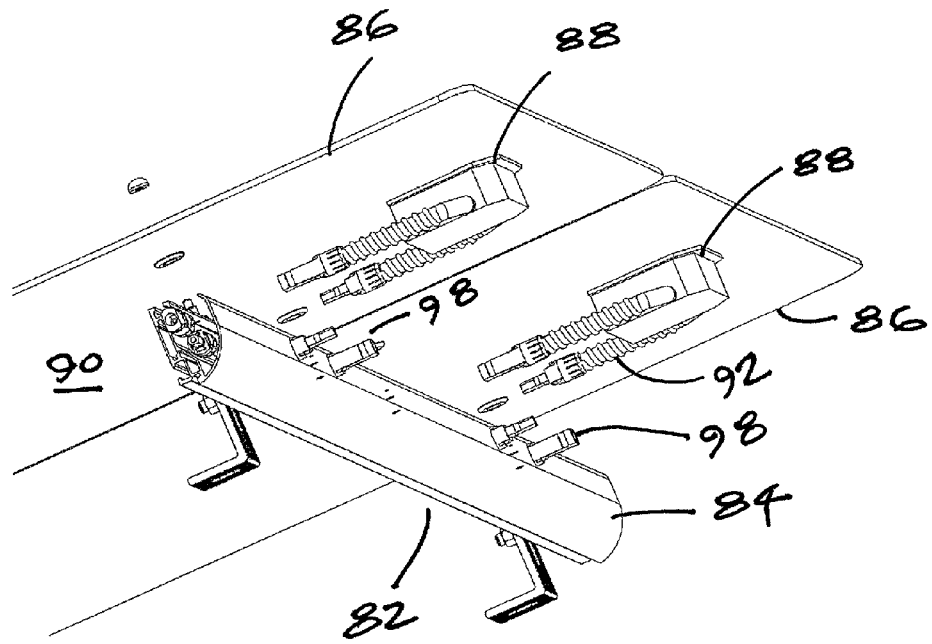
FIG. 7 shows a bottom perspective view of a PV panel with the junction boxes being connected to the inter-module wiring.
Figure 8:
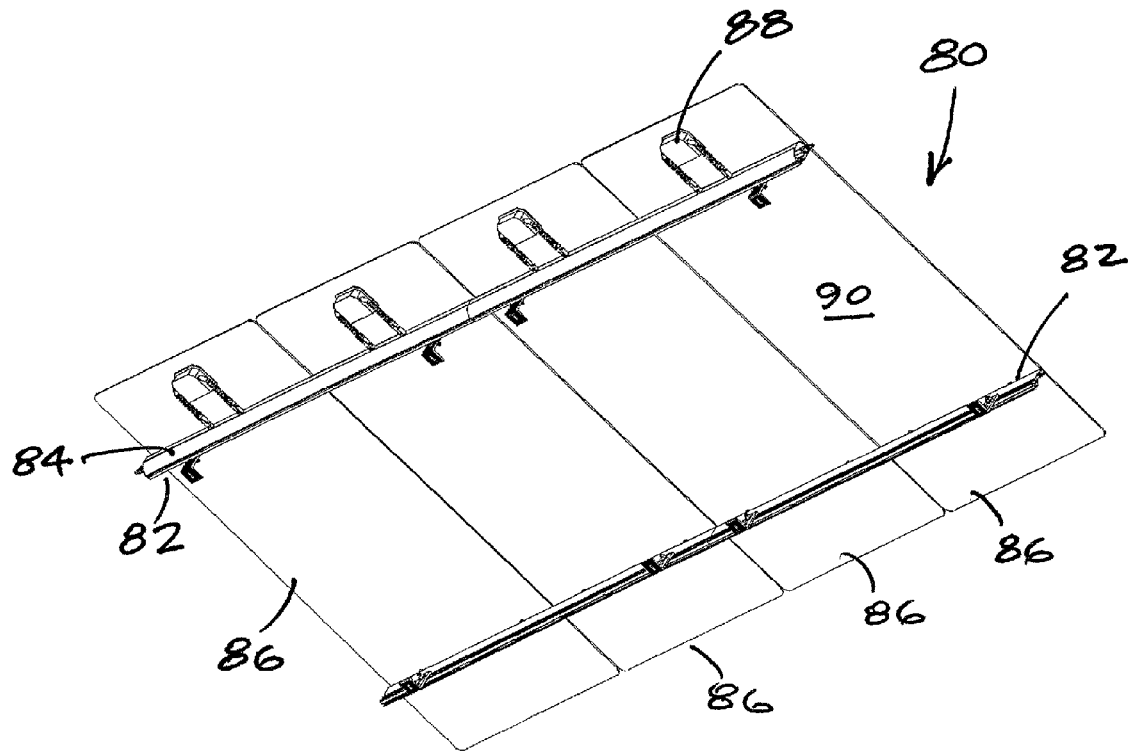
FIG. 8 shows a perspective bottom view of a PV panel with a plurality of junction boxes connected to the inter-module wiring.
Figure 9:
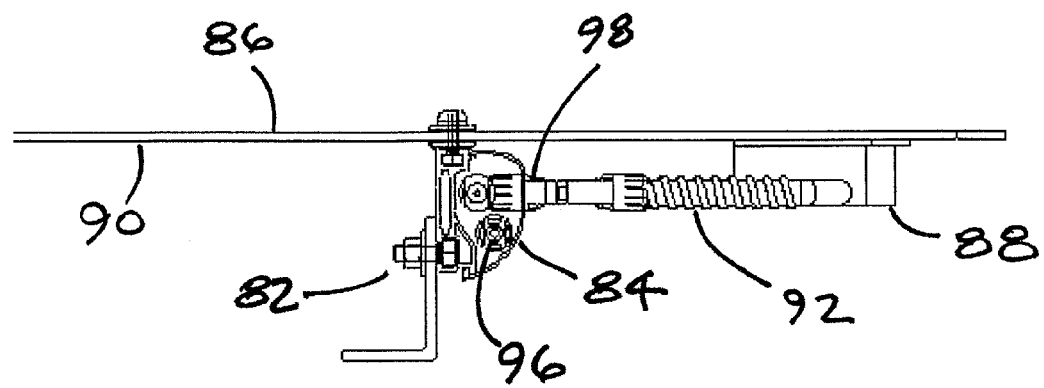
FIG. 9 is a side view of a junction box connected to the inter-module wiring.
Figure 10:
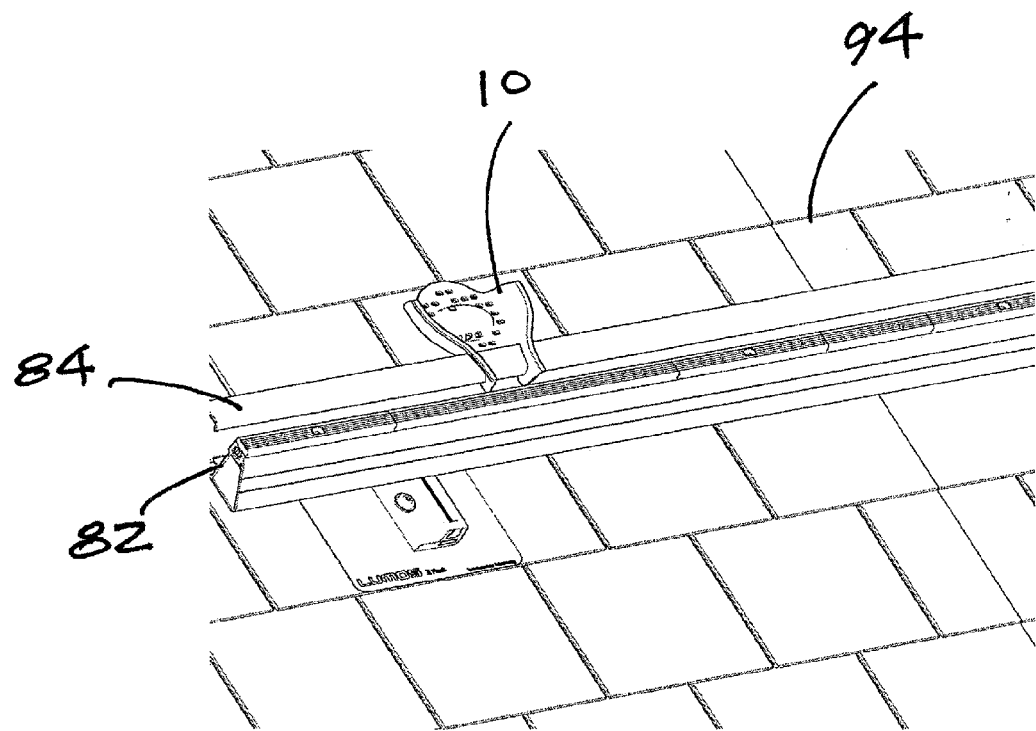
FIG. 10 shows a top perspective view of the first embodiment of the junction cover installed on the rail for the inter-module wiring.
Figure 11:
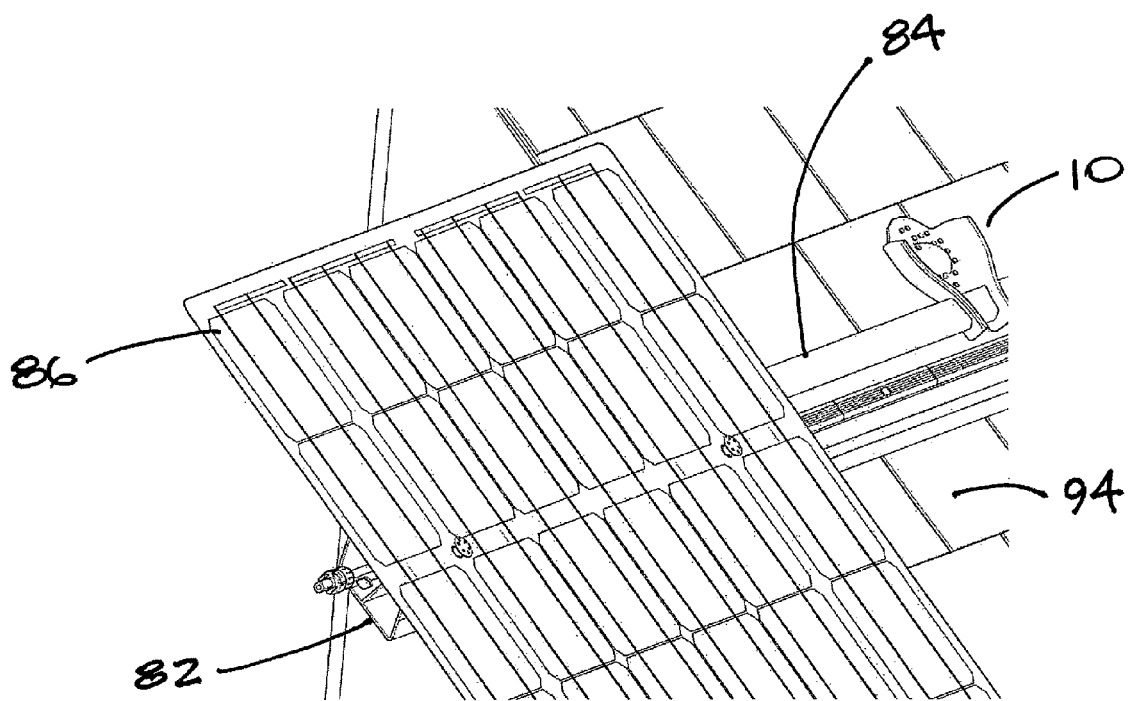
FIG. 11 shows a top perspective view of a PV panel being installed onto a rail with a junction cover.

FIG. 6 shows how the junction covers 10 are attached to the rail 84 in locations corresponding to the junction boxes 88 on the PV modules 86. FIG. 7 shows the wiring 92 from the junction boxes 88 being connected to the electrical connection stations 98 on the rail 84. FIG. 8 shows a bottom view of the PV panel module system 80 after the PV modules 86 have been attached to the panel mounting structure 82. FIG. 9 shows a side view of the connection between the junction box 88 and the electrical connection station 98. This figure illustrates how the wiring 92 between the junction box 88 and the electrical connection station 98 is exposed. FIG. 10 shows a cover 10 attached to a rail 84 prior to the installation of the PV panel 86 on the PV panel mounting structure 82 and FIG. 11 shows the PV panel 86 being placed onto the cover 10 and the mounting structure 82.

Figure 12:
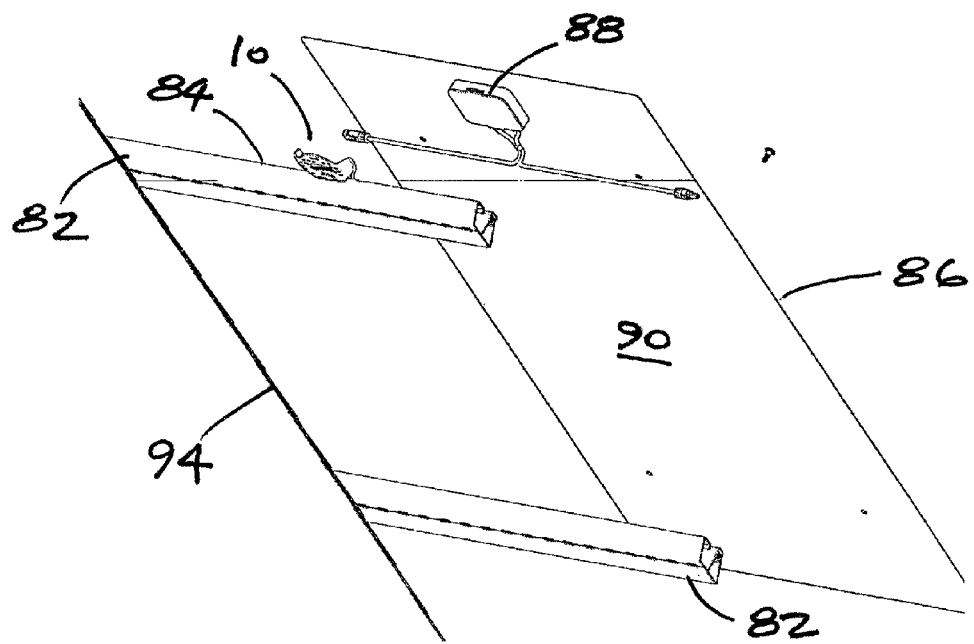
FIG. 12 is a bottom perspective exploded view showing a PV panel with a junction box being attached to a rail with the first embodiment of the junction cover.
Figure 13:
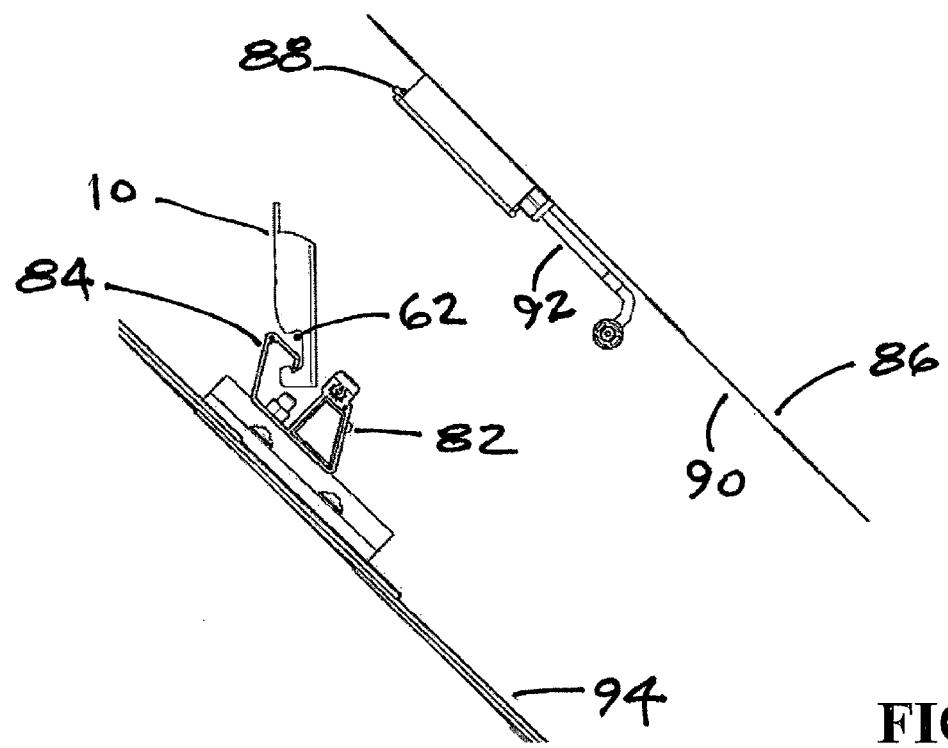
FIG. 13 is a side view showing the first embodiment of the junction cover being installed on a rail and a PV panel with a junction box being positioned on the rail.

FIG. 12 shows a bottom exploded view of a PV panel 86 with a junction box 88 being positioned on the mounting structure 82 so that the cover 10, which is already installed on the rail 84, receives the junction box 88 and the wiring 92. The installation of the PV panel 86 is shown in more detail in FIGS. 13 and 14. When the rail 84 is positioned in the channel 62 and the notches 52, 54 (FIG. 1) engage the rail 84, the PV panel 86 is securely attached to the PV panel mounting structure 82 (as shown in FIG. 14) and the junction cover 10 cannot be removed without detaching the PV panel 86 from the mounting structure 82.

FIGS. 15-21 show a second embodiment of the junction cover 110 and FIGS. 15-18 show the junction cover 110 having a base section 112 formed by a plate 114 with first and second side walls 116, 118 extending downwardly therefrom to a pair of edges 120, 122 to define an interior 124 with an interior surface 126. The junction cover 110 also includes a nose section 128 extending from the base section 112 to an open end 130. The nose section 128 has a top wall 132, two sides 134, 136 formed by the side walls 116, 118 of the base section 112 and an open side 138 opposite the top wall 132. A pair of feet 140, 142 extends from either side of the open end 130 of the nose section 128. The feet 140, 142 engage the rail 184 (FIGS. 19 and 21) to secure the junction cover 110 in place.

The base section 112 can also have four flexible legs 144, 146, 148, 150 extending from the side walls 116, 118. The legs 144, 146, 148, 150 can further define the interior 124 and form part of the interior surface 126. One or more ribs 152 having a stepped receiving portion 154 (FIG. 18) extend(s) from the interior surface 126 of the flexible legs 144, 146, 148, 150. The stepped receiving portions 154 receive the corners of the junction box 188 to secure the junction cover 110 to the junction box 188. Two of the legs 144, 146 have an aperture 156 adjacent to the one or more ribs 152, and a tool (not shown) can be inserted into at least one of the apertures 156 to remove the junction cover 110 from the junction box 188. The base section 112 and/or the nose section 128 can also have a plurality of apertures 166 to provide ventilation and prevent water from collecting in the cover 110.

Figure 19:
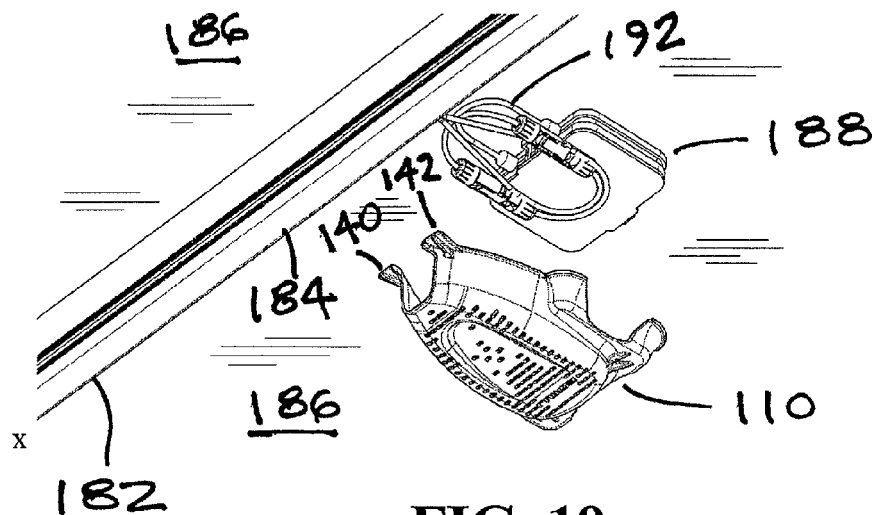
FIG. 19 is a bottom perspective view of the second embodiment of the junction cover being installed over a junction box attached to a PV panel.
Figure 20:
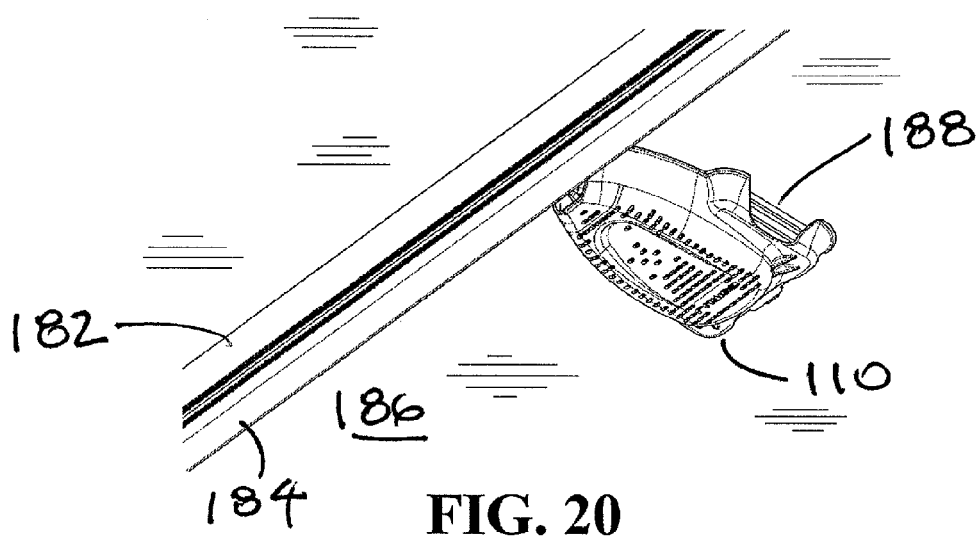
FIG. 20 is a bottom perspective view of the second embodiment of the junction cover shown in FIG. 19 installed over the junction box attached to the PV panel.
Figure 21:
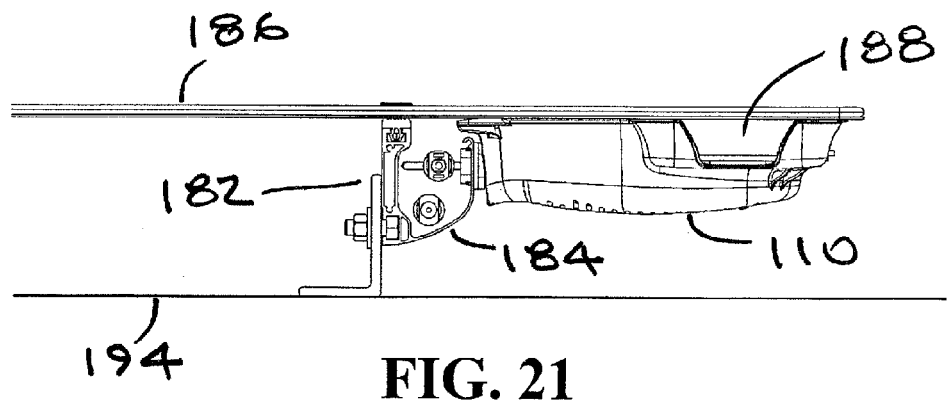
FIG. 21 is a side view of the second embodiment of the junction cover shown in FIG. 19 installed over the junction box attached to the PV panel.

FIGS. 19-21 show the second embodiment of the junction cover 110 being used with a photovoltaic (PV) panel module system substantially the same as the one shown in FIGS. 6-14. FIG. 19 shows a junction box 188 mounted on the rear surface 190 of a PV panel 186 (opposite the surface disposed towards the sun) and wiring 192 connecting the rail 184 and the junction box 188. The rail 184 is part of the PV panel mounting structure 182 for the PV panel module system.

FIG. 19 shows the junction cover 110 being placed over a junction box 188 that is attached to a PV panel 186 so that the ribs 152 (FIG. 17) engage the corners of the junction box 188 to secure the junction cover 110 to the junction box 188. FIG. 20 shows the junction cover 110 after it is installed on the junction box 188 with the feet 140, 142 of the junction cover 110 positioned between the rail 184 and the PV panel 188. FIG. 21 shows how the junction cover 110 covers the junction box 188 and the wiring 192 (FIG. 19) connecting the junction box 188 to the rail 184. The rail 184 is part of the mounting structure 182, which is used to attach the PV module 186 to a structure 194.

Figure 22:
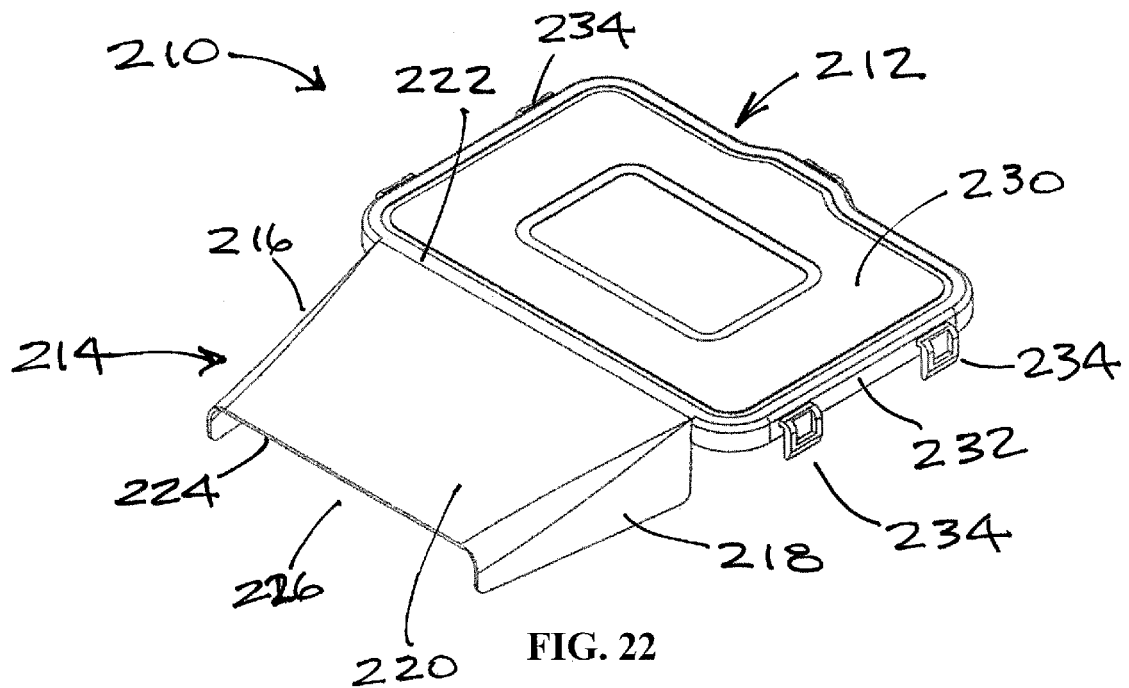
FIG. 22 is a top perspective view of a third embodiment of the junction cover of the present invention.
Figure 23:
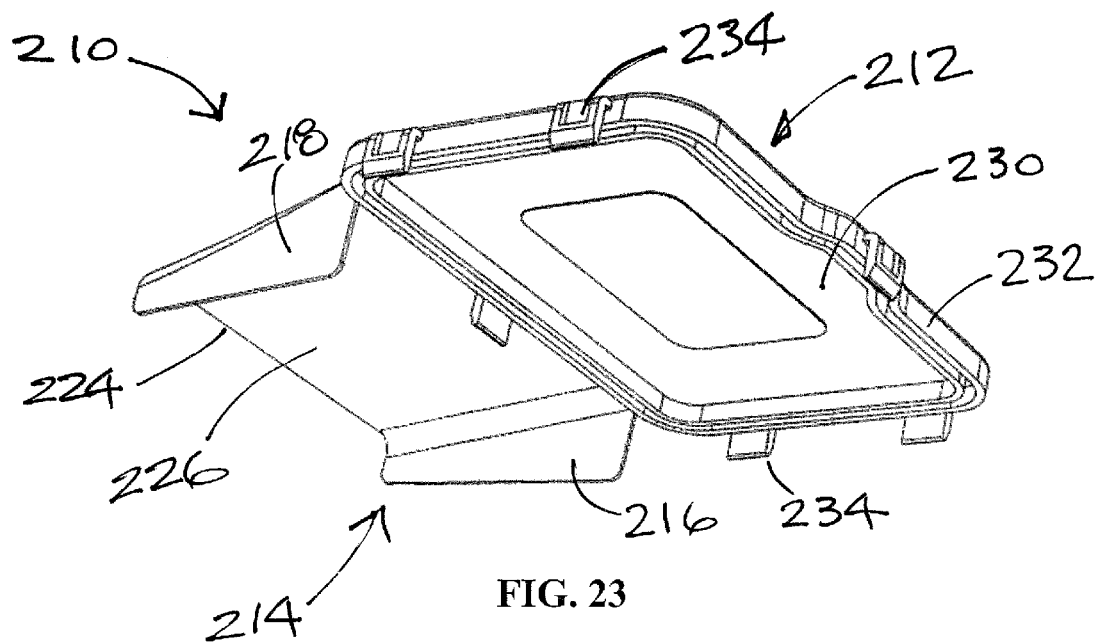
FIG. 23 is a bottom perspective view of the third embodiment of the junction cover shown in FIG. 22.

The third embodiment of the junction cover 210 is shown in FIGS. 22-28. FIGS. 22 and 23 show a top perspective view and a bottom perspective view, respectively, of the junction cover 210, which includes a lid 212 and wire housing 214. The wire housing 214 is formed by two side walls 216, 218 that extend downwardly from a top plate 220. The proximal end 222 of the top plate 220 is connected to the lid 212 and the top plate 220 slopes downwardly and away from the lid 212 to a distal end 224 to define an interior space 226 beneath the top plate 220 and between the side walls 216, 218. Because the top plate 220 slopes downwardly from the lid 212, the side walls 216, 218 have a greater height at the proximal end 222 than at the distal end 224 of the wire housing 214.

The lid 212 has a base plate 230 and a perimetrical side wall 232 that extends downwardly, and preferably continuously, around the base plate 230. The perimetrical side wall 232 has one or more fastening means, such as the latches 234 shown in FIGS. 22 and 23, for securing the lid 230 to a junction box 288 (see FIG. 25). The latches 234 engage catches 294 on the exterior wall of the junction box 288 and, after the latches 234 are secured in the catches 294, the junction cover 210 is securely and releasably attached to the junction box 288.

Figure 24:
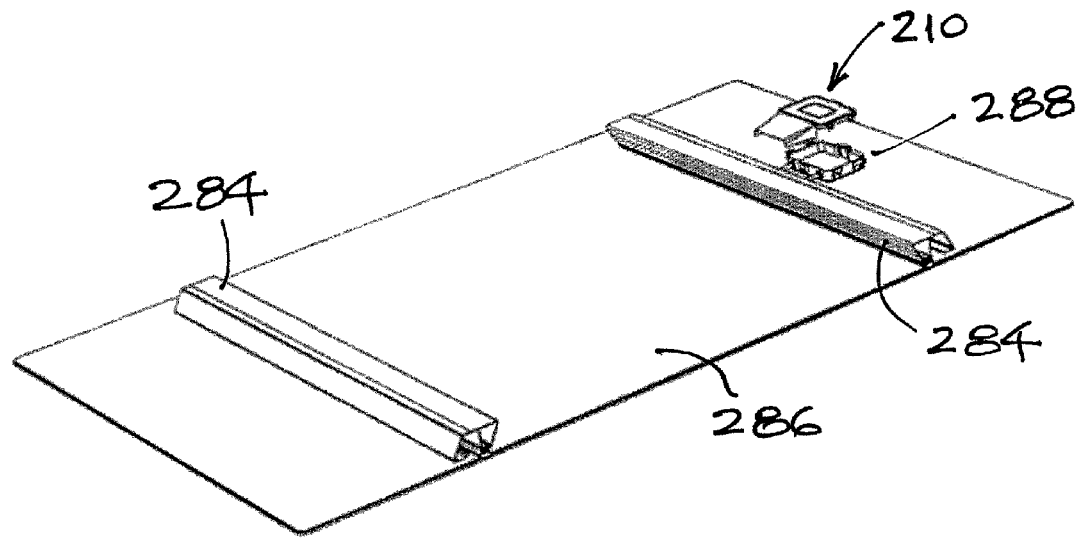
FIG. 24 is a perspective view of the third embodiment of the junction cover shown in FIG. 22 prior to installation on a junction box on the back side of a PV panel.
Figure 25:
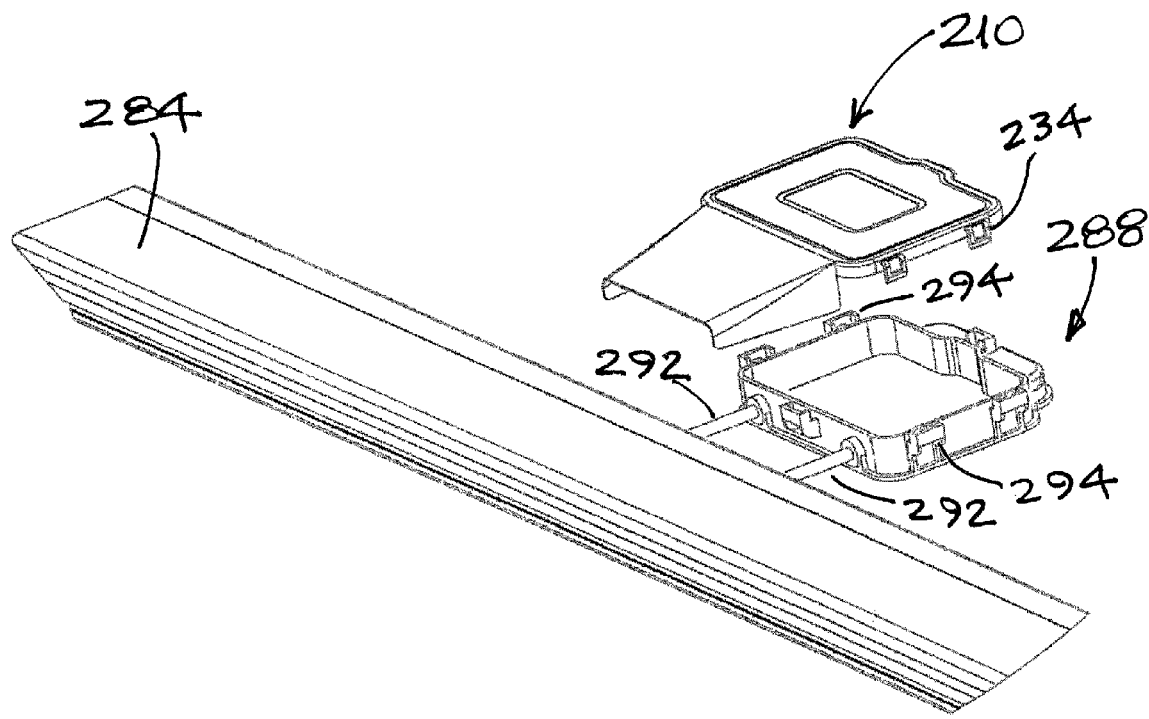
FIG. 25 is an enlarged perspective view of the third embodiment of the junction cover shown in FIG. 24.

FIG. 24 shows the back side of a PV panel 286 attached to a pair of mounting rails 284. A junction box 288 is mounted next to one of the rails 284 and the junction cover 210 is placed over the junction box 288. FIG. 25 shows the rail 284, junction box and junction cover 210 in FIG. 24 in more detail. In particular, FIG. 25 shows how the latches 234 on the lid 212 of the junction cover 210 align with the catches 294 on the junction box 288. FIG. 25 also shows the wires or cables 292 for the electrical circuits in the PV panel 286 that are connected between the rail 284 and the junction box 288.

Figure 26:
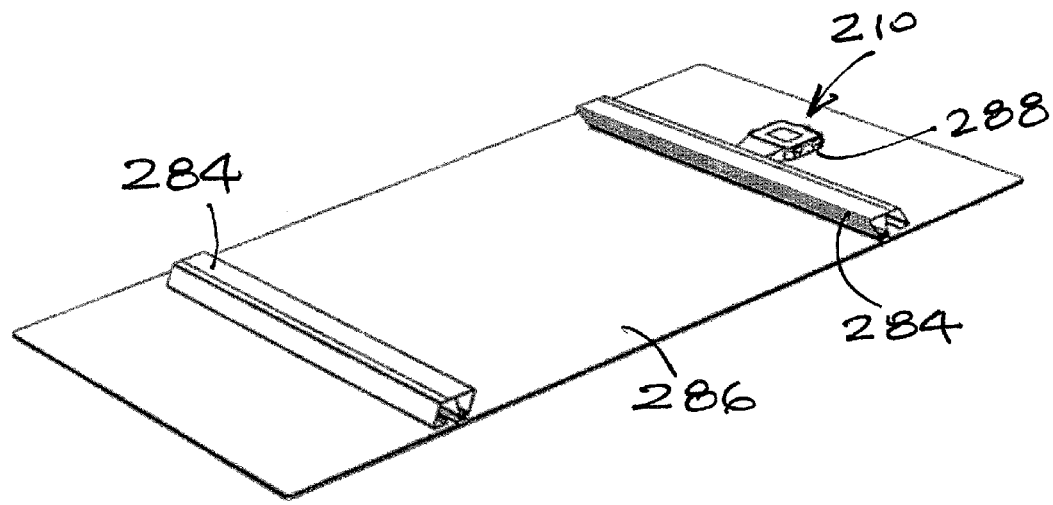
FIG. 26 is a perspective view of the third embodiment of the junction cover shown in FIG. 22 installed on a junction box on the back side of a PV panel.
Figure 27:
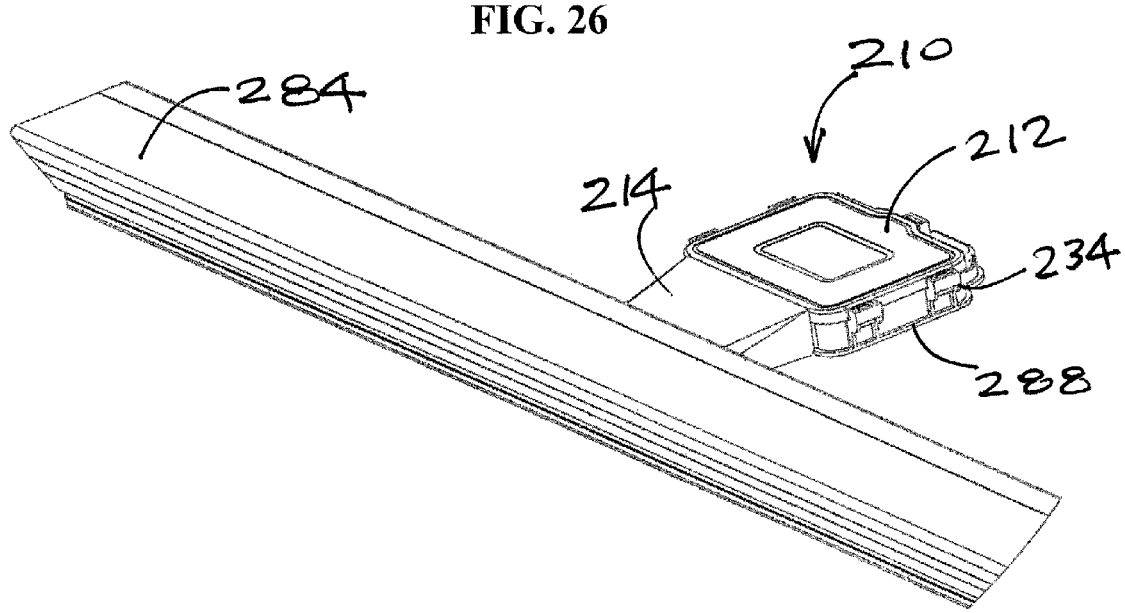
FIG. 27 is an enlarged perspective view of the third embodiment of the junction cover shown in FIG. 26.
Figure 28:
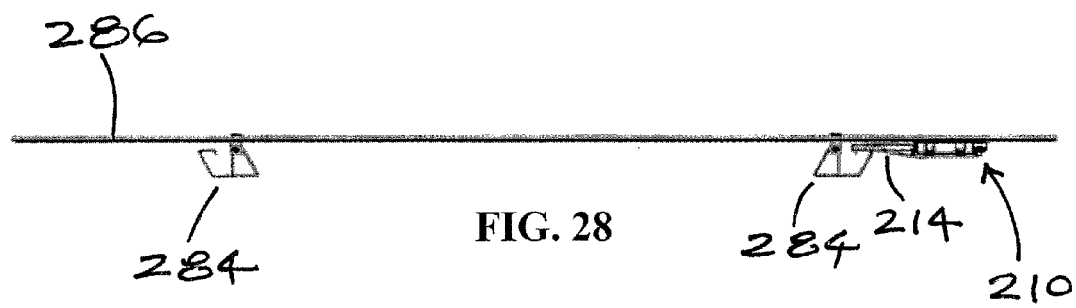
FIG. 28 is a side view of the third embodiment of the junction cover shown in FIG. 26.

FIGS. 26 and 27 show the junction cover 210 after it is installed on the junction box 288 mounted on the back of a PV panel 286. After the latches 234 are locked onto the catches 294, the junction cover 210 is secured to the junction box 288 and the wires or cables 292 (see FIG. 25) are enclosed by the wire housing 214 and protected from damage. The shape of the lid 210 can vary to fit the dimensions of the junction box 288. FIG. 28 is a side view of the PV panel 286, mounting rails 284 and the junction cover 210 shown in FIGS. 26 and 27. The distal end 224 of the wire housing 214 (see FIG. 22) extends under the mounting rail 28 so that the wires/cables 292 (see FIG. 25) are protected between the rail 284 and the junction box 288.

Having described the preferred embodiments herein, it should now be appreciated that variations may be made thereto without departing from the contemplated scope of the invention. Accordingly, the preferred embodiments described herein are deemed illustrative rather than limiting the true scope of the invention being set forth in the claims appended hereto.

We claim:

1. A junction cover for a photovoltaic (PV) panel module system that includes a PV panel mounting structure, a rail, a PV module with a junction box and wiring extending between the rail and the junction box, wherein the junction cover encloses the junction box and the wiring and comprises:
    a lid comprising a plurality of sides wherein the lid is releaseably attached to the junction box; and
    a wire housing comprising a top plate having proximal and distal ends, first and second sides and first and second side walls extending downwardly from the first and second sides, wherein the top plate extends from the proximal end connected to a first side of the lid and slopes downwardly to the distal end, and wherein the top plate and side walls define an interior and an opening at the distal end,
    wherein, when the lid is attached to the junction box, the wiring extending between the rail and the junction box is entirely within the wire housing.

2. The junction cover according to claim 1, wherein the lid further comprises one or more attachment means for securing the lid to the junction box.

3. The junction cover according to claim 2, wherein the attachment means are prongs or latches extending from one or more of the plurality of sides of the lid, and wherein the prongs engage apertures or the latches engage catches on the junction box.

4. The junction cover according to claim 2, wherein the attachment means are clips extending from one or more of the plurality of sides, and wherein the clips engage recessed areas on the exterior of the junction box.

5. The junction cover according to claim 1, wherein the side walls are triangularly shaped.

6. The junction cover according to claim 1, wherein the side walls are substantially parallel or extend inwardly between the proximal end and distal end of the housing.

7. The junction cover according to claim 1, wherein each of the first and second side walls of the wire housing has a first height at the proximal end and a second height at the distal end, and wherein the first height is at least twice as high as the second height.

8. The junction cover according to claim 1, wherein the lid has a perimetrical side wall extending downwardly and continuously from the plurality of sides.

9. The junction cover according to claim 8, wherein the side walls of the wire housing extend below the perimetrical side wall of the lid.

10. The junction cover according to claim 8, wherein the perimetrical side wall of the lid sealably encloses the junction box.

11. A junction cover for a photovoltaic (PV) panel module system that includes a PV panel mounting structure, a rail, a PV module with a junction box and wiring extending between the rail and the junction box, wherein the junction cover encloses the junction box and the wiring and comprises:
- a lid comprising a base plate, a plurality of sides, a perimetrical side wall extending downwardly from the plurality of sides and one or more attachment means for securing the lid to the junction box, wherein the lid is releaseably attached to the junction box; and
- a wire housing comprising a top plate having proximal and distal ends, first and second sides and first and second side walls extending downwardly from the first and second sides, wherein the top plate extends from the proximal end connected to a first side of the lid and slopes downwardly to the distal end, and wherein the top plate and side walls define an interior and an opening at the distal end,
- wherein, when the lid is attached to the junction box, the wiring extending between the rail and the junction box is entirely within the wire housing.

12. The junction cover according to claim 11, wherein the lid comprises one or more attachment means on at least two of the plurality of sides.

13. The junction cover according to claim 11, wherein the attachment means are prongs or latches extending from one or more of the plurality of sides, and wherein the prongs engage apertures or the latches engage catches on the junction box.

14. The junction cover according to claim 11, wherein the attachment means are clips extending from one or more of the plurality of sides, and wherein the clips engage recessed areas on the exterior of the junction box.

15. The junction cover according to claim 11, wherein the side walls are triangularly shaped.

16. The junction cover according to claim 1, wherein the side walls are substantially parallel.

17. The junction cover according to claim 11, wherein each of the first and second side walls of the wire housing has a first height at the proximal end and a second height at the distal end, and wherein the first height is at least twice as high as the second height.

18. The junction cover according to claim 11, wherein the perimetrical side wall extends continuously around the plurality of sides.

19. The junction cover according to claim 18, wherein the side walls of the wire housing extend below the perimetrical side wall of the lid.

20. The junction cover according to claim 18, wherein the perimetrical side wall of the lid sealably encloses the junction box.

* * * * *